United States Patent
Wang et al.

(10) Patent No.: US 8,487,661 B2
(45) Date of Patent: Jul. 16, 2013

(54) ZERO-CROSSING GAIN CONTROL SYSTEM AND ASSOCIATED METHODS

(75) Inventors: Haishi Wang, Chengdu (CN); Rui Wang, Chengdu (CN); Lei Li, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 91 days.

(21) Appl. No.: 13/211,116

(22) Filed: Aug. 16, 2011

(65) Prior Publication Data
US 2012/0039425 A1    Feb. 16, 2012

(30) Foreign Application Priority Data

Aug. 16, 2010 (CN) .......................... 2010 1 0254427

(51) Int. Cl.
*H03K 5/22*       (2006.01)
*H03K 5/153*      (2006.01)

(52) U.S. Cl.
USPC ............... 327/79; 327/77; 327/178; 327/179; 375/345; 375/346; 375/351

(58) Field of Classification Search
USPC ......... 327/178, 179, 180, 77, 78, 79; 375/345
See application file for complete search history.

(56) References Cited

U.S. PATENT DOCUMENTS 6,687,068 B2 *   2/2004   Kanai ............................ 360/46

* cited by examiner

*Primary Examiner* — John Poos
(74) *Attorney, Agent, or Firm* — Perkins Coie LLP

(57) ABSTRACT

A zero-crossing gain control system is disclosed herein. The system comprises a gain control unit for amplifying an input signal to an output signal, a zero-crossing monitoring circuit for monitoring the input signal or output signal, and a register for latching the digital control signal and generating a gain control signal that controls the gain control unit. The system may further comprise a maximum write time setting circuit for generating a write signal. The digital control signal is written into the register when a zero-crossing state is monitored or a maximum write time since a change occurred on of the digital control signal is expired. An automatic gain control system is also disclosed herein and further comprises a peak detecting circuit for detecting the level of output signal, a logic circuit for lowering or restoring the digital control signal according to the result from the peak detecting circuit.

17 Claims, 10 Drawing Sheets

US 8,487,661 B2

ZERO-CROSSING GAIN CONTROL SYSTEM AND ASSOCIATED METHODS

CROSS-REFERENCE TO RELATED APPLICATION(S)

This application claims the benefit of CN application No. 201010254427.6, filed on Aug. 16, 2010, and incorporated herein by reference.

TECHNICAL FIELD

The disclosed technology relates to amplifiers, and in particular but not exclusively relates to audio amplifiers having an automatic gain control system.

BACKGROUND

Voice is stored and processed in the form of voltage signals in audio information processing systems. As the volume of the voice changes greatly, the voltage signal which reflects the volume of voice also changes greatly and may be clamped within the system circuitry or by power supplies with a fixed gain amplifier. Therefore the clamped audio signal may have serious distortion and may damage external equipment. To solve such issues, the gain control system, particularly the automatic gain control system, is widely used in audio amplification systems.

FIG. 1 is a single-ended input and single-ended output gain control unit 10. $V_{IN}$ is an input signal and $V_O$ is an output signal of the gain control unit 10. The positive input end of the amplifier U1 is coupled to a bias voltage which may be half of the power supply voltage (VDD/2). For better understanding, the bias voltage is at a level equal to VDD/2 in the following analysis. The negative input end of the amplifier U1 is coupled to a resistor network through switches S1, S2, S3 and S4. The output end of the amplifier U1 is coupled to $V_O$.

Switches S1, S2, S3 and S4 are controlled by a 2-bit digital signal. Variety of gains will be obtained when the switches are in different ON (closed) or OFF (opened) states. This gain control unit is simple and practical, but may induce a glitch on the output signal when the gain of the gain control unit is shifted.

FIG. 2A depicts a wave form of an input signal 201 according to the gain control units 10 shown in FIG. 1. FIG. 2B depicts a wave form of an output signal 202 corresponding to the input signal in FIG. 2A. At the moment T1, the gain of the amplifier is changed. A dotted line 203 reflects the wave form of the output signal if the gain is not changed. The output signal drops from dotted line 203 and a serious glitch is generated at time T1 when the digital control signal is changed. The glitch causes a drastic current change which may damage external devices.

SUMMARY

In one embodiment, a zero-crossing gain control system comprises a gain control unit, a zero-crossing monitoring circuit and a register coupled between the zero-crossing monitoring circuit and the gain control unit. Wherein the gain control unit comprises an input end configured to receive an input signal, and an output end configured to provide an output signal, and a control end configured to receive a gain control signal; the zero-crossing monitoring circuit is coupled to the output end or input end of the gain control unit, responsive from either the input signal or the output signal, operable to generate a zero-crossing signal when the output signal or the input signal crosses zero; and the register is coupled between the zero-crossing monitoring circuit and the control end of the gain control unit, configured to latch a digital control signal and generates the gain control signal according to the zero-crossing signal and the digital control signal.

BRIEF DESCRIPTION OF THE DRAWINGS

Non-limiting and non-exhaustive embodiments of the present invention are described in the following figures, wherein like reference numerals and labels refer to like parts throughout the various views, unless otherwise specified.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Non-limiting and non-exhaustive embodiments of the present invention are described in detailed herein. Reference throughout this specification to "one embodiment" or "an embodiment" means that a particular feature, structure, or characteristic described in connection with the embodiment is included in at least one embodiment of the present invention, thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The "zero" in "zero-crossing" refers to alternating current (AC) zero. When a single-ended signal crosses zero, it means that the signal is equal to a common-mode level. While a pair of differential signal crosses zero, it means the two signals for the differential signal are equal.

Figure 1:
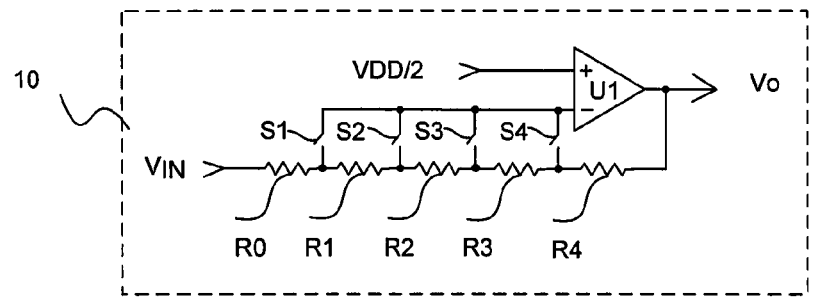
FIG. 1 shows a single-ended input and single-ended output gain control unit 10.
Figure 2A:
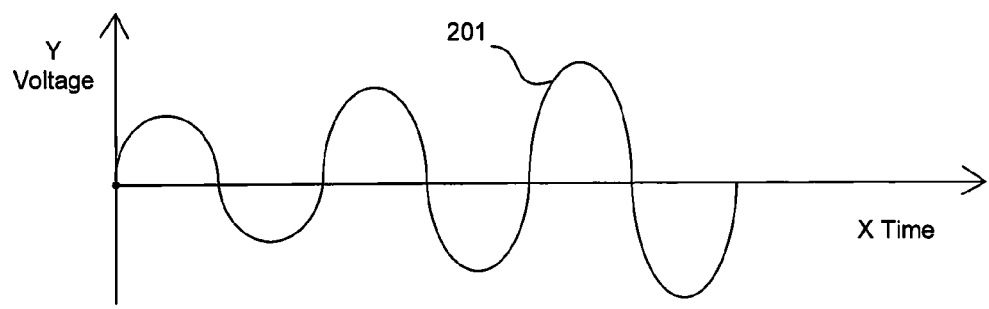
FIG. 2A and FIG. 2B depict the operational wave forms according to the gain control units 10 shown in FIG. 1.
Figure 2B:
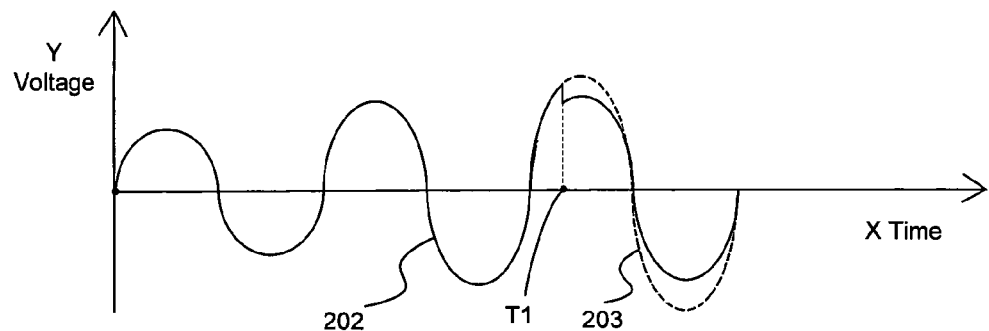
Figure 3:
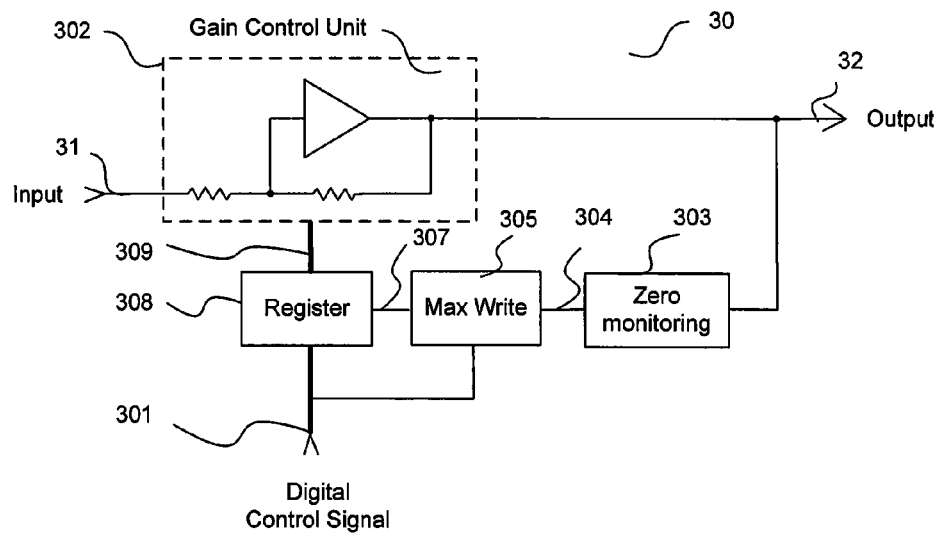
FIG. 3 depicts a zero-crossing gain control system 30 according to an embodiment of the present invention.

FIG. 3 depicts a zero-crossing gain control system 30 according to an embodiment of the present invention. Gain control system 30 comprises an input end 31 for receiving an input signal, an output end 32 for generating an output signal, and a control end 301 for receiving a digital control signal. A gain control unit 302 is coupled between the input end 31 and the output end 32 configured to determine the system gain according to a gain control signal received from a gain control end 309 of gain control unit 302. A zero-crossing monitoring circuit 303 is coupled to the output end 32 configured to monitor the output signal and responsive to generate a zero-crossing signal 304. A maximum write time setting circuit 305 is coupled to the control end 301, configured to receive a digital control signal and zero-crossing signal 304 and accordingly to generate a write signal 307 at a proper time. A register 308 is coupled between control end 301 and gain control unit 302, configured to latch digital control signal and to generate a gain control signal at gain control end 309 in accordance to the digital control signal and the write signal 307.

Once the system is operating, zero-crossing monitoring circuit 303 generates zero-cross signal 304 when the output signal crosses alternating current (AC) zero. Maximum write time setting circuit 305 monitors the changes of digital control signal at control end 301 and sets a delay period T2 as a maximum write time after a change occurred in the digital control signal at control end 301. During the delay period T2, if zero-crossing monitoring circuit 303 generates a zero-crossing signal 304, maximum write setting circuit 305 generates write signal 307 immediately. Otherwise, if zero-crossing signal 304 is not generated for the whole delay period T2, maximum write circuit 305 generates write signal 307 at the end of the delay period T2. Register 308 latches the digital control signal at control end 301 when it receives write signal 307, and then generates gain control signal at gain control end 309 to control gain control unit 302. Moreover, even though no change occurs on the digital control signal at control end 301, maximum write time setting circuit 305 may also generate write signal 307 when the output signal crosses zero. For this occasion, because digital control signal doesn't change, the generated write signal 307 could not influence the system gain.

The range of the maximum write time, or delay period T2 may be from zero to infinite, and may also be adjusted externally. In one embodiment, the delay period T2 is set to zero. Digital control signal at control end 301 is written into register 308 immediately once a change occurs to digital control signal. In another embodiment, the delay period T2 is set to infinite. Digital control signal at control end 301 is written into register 308 only if the output signal crosses zero.

Figure 4:
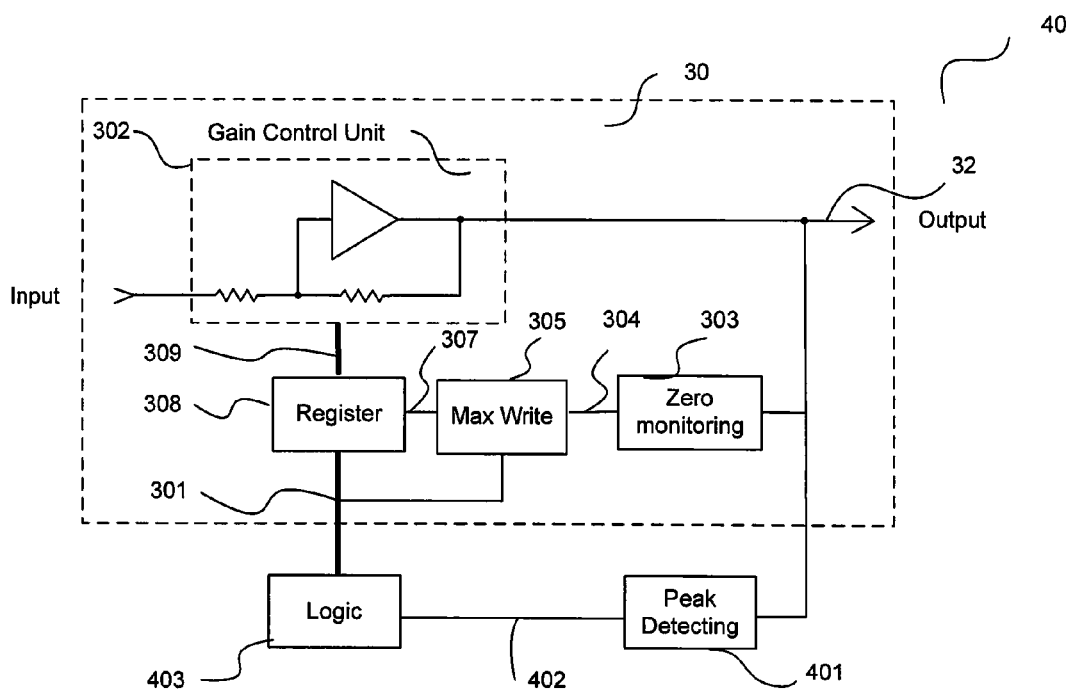
FIG. 4 depicts an automatic zero-crossing gain control system 40 according to another embodiment of the present invention.

FIG. 4 illustrates an automatic gain control system 40 according to an embodiment of the present invention. Automatic gain control system 40 comprises a zero-crossing gain control system 30, a peak detecting circuit 401 and a logic circuit 403. Peak detecting circuit 401 is coupled to the output end 32 of system 30, configured to monitor the output signal and to generate an overrun incidents signal 402 when the output signal exceeds a predetermined threshold. Logic circuit 403 is coupled between peak detecting circuit 401 and zero-crossing gain control system 30, configured to receive overrun incident signal 402 and to generate a digital control signal at control end 301. In one embodiment, logic circuit 403 may lowers or restores digital control signal according to the overrun incidents signal 402.

Figure 5:
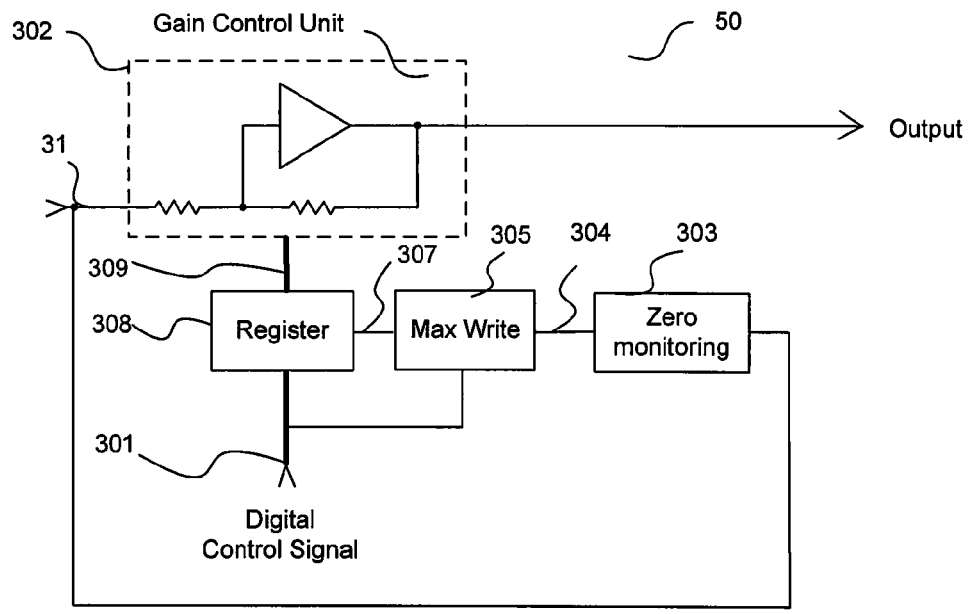
FIG. 5 depicts a zero-crossing gain control system 50 according to yet another embodiment of the present invention.

As shown in FIG. 5, a zero-crossing gain control system 50 is disclosed according to an embodiment of the present invention. System 50 shown is analogous to the system 30 in FIG. 3. The primary difference between system 50 and system 30 is that the zero-crossing monitoring circuit 303 of system 50 is coupled to the input end 31 but not to the output end, configured to generate zero-crossing signal 304 when the input signal crosses AC zero.

Figure 6:
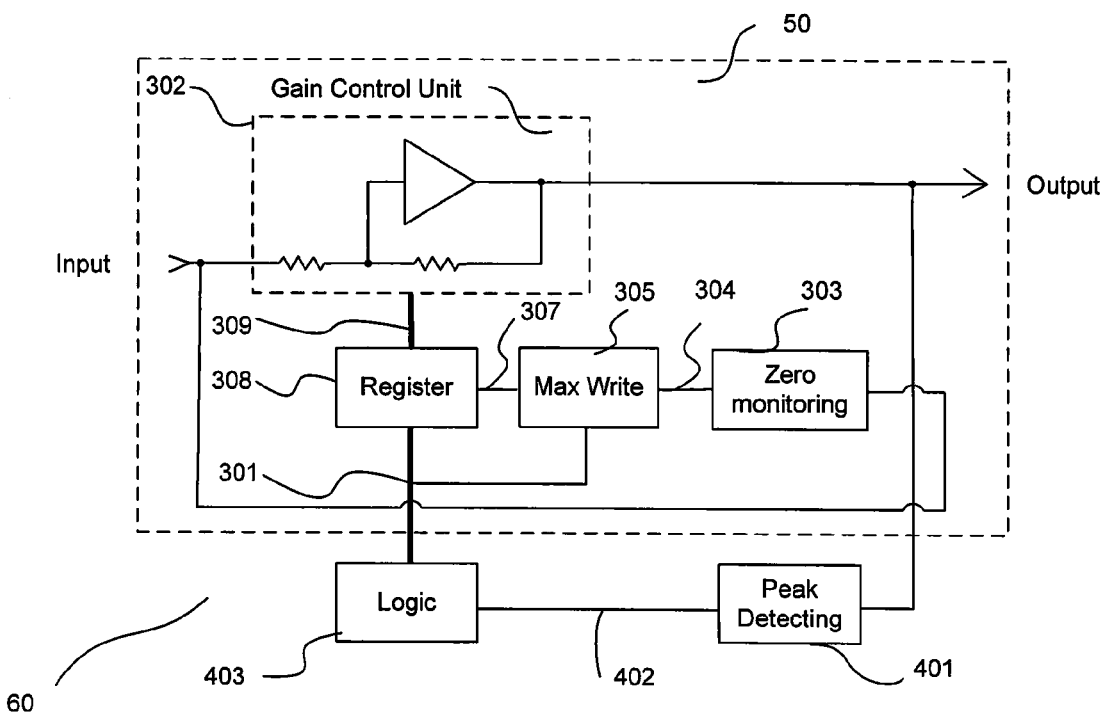
FIG. 6 depicts an automatic zero-crossing gain control system 60 according to still another embodiment of the present invention.

Referring to FIG. 6, the diagram illustrates an automatic gain control system 60 according to an embodiment of the present invention. System 60 is analogous to the system 40 in FIG. 4. More specifically, the main difference between the system 60 and the system 40 is that zero-crossing gain control system 30 is replaced by zero-crossing gain control system 50. Compared with system 50, automatic gain control system 60 further comprises a peak detecting circuit 401 and a logic circuit 403.

Figure 7A:
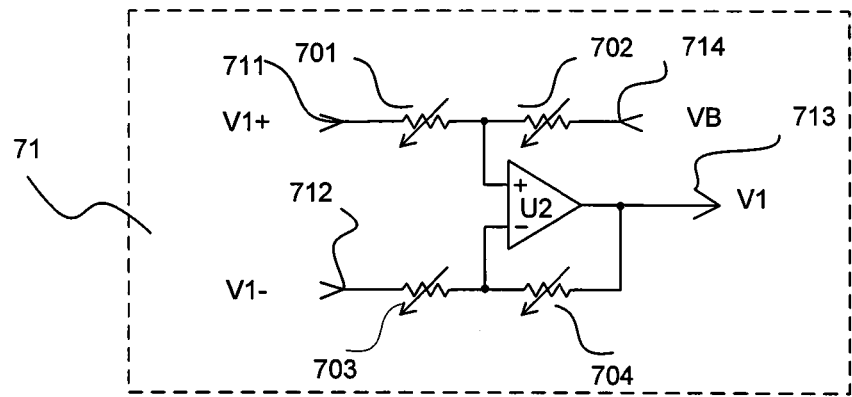
FIG. 7A depicts a differential input and single-ended output gain control unit 71 according to an embodiment of the present invention.
Figure 7B:
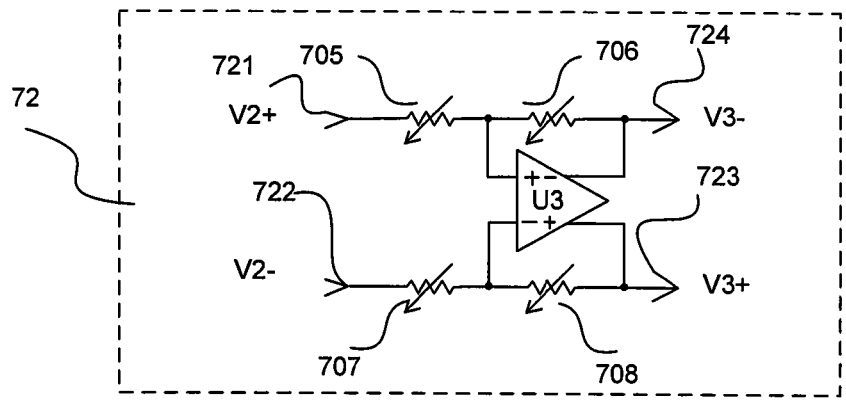
FIG. 7B depicts a differential input and differential output gain control unit 72 according to another embodiment of the present invention.

FIG. 7A and FIG. 7B illustrates some schematic structures of gain control unit 302 according to some embodiments of the present invention. Seen in FIG. 7A, in the illustrated embodiment, gain control unit 71 is a differential input and single-ended output gain control unit, and has a first input end 711 and a second input end 712 for receiving a pair of differential signal V1+ and V1− respectively, an output end 713 for generating an output signal V1, and a bias end 714 for receiving a bias voltage VB. In one embodiment, VB equals to VDD/2. Rheostats 701 and 702 comprise a voltage divider, coupled between first input end 711 and bias end 714. The common end of rheostats 701 and 702 is coupled to a positive input end of an amplifier U2. Rheostats 703 and 704 comprise another voltage divider, coupled between second input end 712 and output end 713. The common end of rheostats 703 and 704 is coupled to a negative input end of the amplifier U2.

An output end of the amplifier U2 serves as output end 713. Gain control unit 71 may further comprise a gain control end (not shown in FIG. 7A) to receive the gain control signal at gain control end 309. When gain control unit 71 is operating, switches (not shown in FIG. 7A) controlled by the gain control signal change the ratio of rheostats 701 and 702, and the ratio of rheostats 703 and 704. Thus variety of system gains is obtained.

Referring to FIG. 7B, a differential input and differential output gain control unit 72 is illustrated according to another embodiment of the present invention. Gain control unit 72 comprises a first input end 721 and a second input end 722 for receiving a pair of differential input signal V2+ and V2− respectively, and a first output end 723 and a second output end 724 for generating a pair of differential output signal V3+ and V3− respectively. Rheostats 705 and 706 comprise a voltage divider, coupled between first input end 721 and a negative output end of a differential amplifier U3. The common end of rheostats 705 and 706 is coupled to a positive input end of the amplifier U3. Rheostats 707 and 708 comprise another voltage divider, coupled between second input end 722 and a positive output end of the amplifier U3. The common end of rheostats 707 and 708 is coupled to a negative end of the amplifier U3. Furthermore, the positive output end of the amplifier U3 serves as first output end 723, and the negative output end of the amplifier U3 serves as second output end 724. The differential amplifier U3 also has a common mode node (not shown) that is coupled to bias voltage VB. Gain control unit 72 may further comprises a gain control end (not shown in FIG. 7A) to receive the gain control signal at gain control end 309. When gain control unit 72 is operating, switches (not shown in FIG. 7B) controlled by gain control signal change the ratio of rheostats 705 and 706, and the ratio of rheostats 707 and 708. Thus variety of system gains is obtained.

One with ordinary skill in relevant art should understand that it may apply similar method to switch the gain of a multi-terminal gain control unit with a random number of input end(s) and output end(s).

Figure 8A:
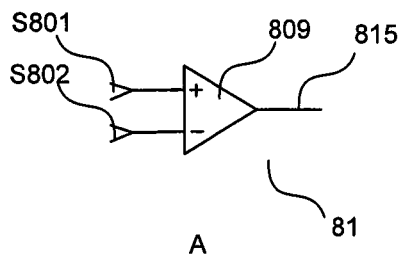
FIG. 8A depicts a schematic circuitry of a zero-crossing monitoring circuit 81 according to certain embodiments of the present invention.
Figure 8B:
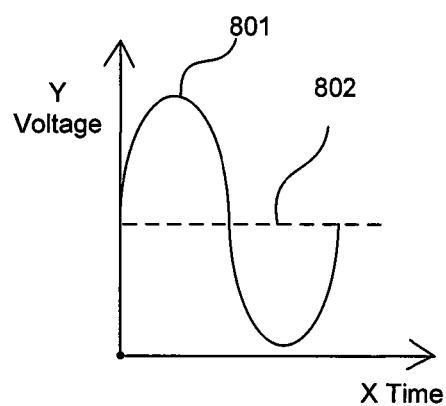
FIG. 8B depicts an operational waveform diagram of the zero-crossing monitoring circuit 81 according to an embodiment of the present invention.

FIG. 8A and FIG. 8B illustrate a zero-crossing monitoring circuit 303 and the corresponding operational waveform diagrams according to some embodiments of the present invention. Generally, the delay between the input signal crossing zero and the output signal crossing zero may be neglected as the transmission delay of an amplifier is small. Therefore cross-zero monitoring circuit 303 may monitor either the input signal or the output signal. However, for a system with large delay or high accuracy, cross-zero monitoring circuit 303 may choose a proper signal to monitor depending on specific requirement.

FIG. 8A shows a schematic circuitry of a zero-crossing monitoring circuit 81 according to an embodiment of present invention. Zero-crossing monitoring circuit 81 comprises a comparator 809, wherein comparator 809 comprises two input ends S801 and S802, and an output end 815. FIG. 8B shows an operational waveform diagram of a single-ended signal 801 and its corresponding common-mode voltage signal 802 according to an embodiment of the present invention. The X-axis represents the time and the Y-axis represents the voltage. A single-ended signal 801 may be an input signal or an output signal, and a common-mode voltage signal 802 is the corresponding input common-mode signal or the output common-mode signal. When circuit 81 is operating, two input ends S801 and S802 of comparator 809 are coupled to (sample) single-ended signal 801 and common-mode voltage signal 802 respectively. Comparator 809 compares the two signals and generates a flip on the output end 815 when signal 801 down-crosses signal 802 from top to bottom or up-crosses signal 802 from bottom to top.

Figure 8C:
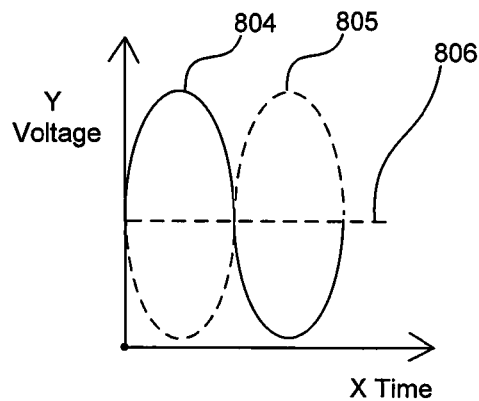
FIG. 8C depicts an operational wave form diagram of zero-crossing monitoring circuit 81 according to some other embodiments of the present invention.

FIG. 8C illustrates an operational wave form diagram of the zero-crossing monitoring circuit 81 according to another embodiment of the present invention. A pair of differential signals 804 and 805 are the output signals of zero-crossing gain control system 30 or input signals of zero-crossing gain control system 30, and a common-mode voltage signal 806 is the corresponding output (input) common mode voltage. In one embodiment, when circuit 81 is operating, two input ends S801 and S802 of comparator 809 are coupled (sample) to differential signals 804 and 805 respectively. Comparator 809 compares signal 804 with signal 805 and generates a flip on the output end 815 when signal 804 down-crosses signal 805 from top to bottom or up-crosses signal 805 from bottom to top. In yet another embodiment, input end S801 may be coupled to one of differential signals 804 and 805. While input end S802 may be coupled to the common-mode voltage signal 806. The afterward operation process is the same as is described in FIG. 8B.

In certain embodiments, the signal at output end 815 is considered as the indication of the system output signal crossing zero.

Furthermore, in other embodiments, zero-crossing monitoring circuit may comprise a hysteresis comparator to avoid oscillating. Because of the existence of hysteresis and the limited precision of comparator, it is impossible to find out a completely zero state. Therefore the "zero" means a near zero state such as with a range of no more than 100 mV. Here the glitch can be ignored since the signal is very small.

The zero-crossing monitoring circuit 81 is latched and may not generate a zero-crossing signal if the monitored signal is zero or very small (less than the resolution of the comparator, for example, no more than 100 mV). The system may take a long time to switch the gain of gain control unit 302 after the change of digital control signal at control end 301 since the frequency of voice is widely distributed. In some embodiments, to avoid such issues, the system may further comprise a maximum write time setting circuit configured to set a longest waiting time after the change of the digital control signal at control end 301.

Figure 9:
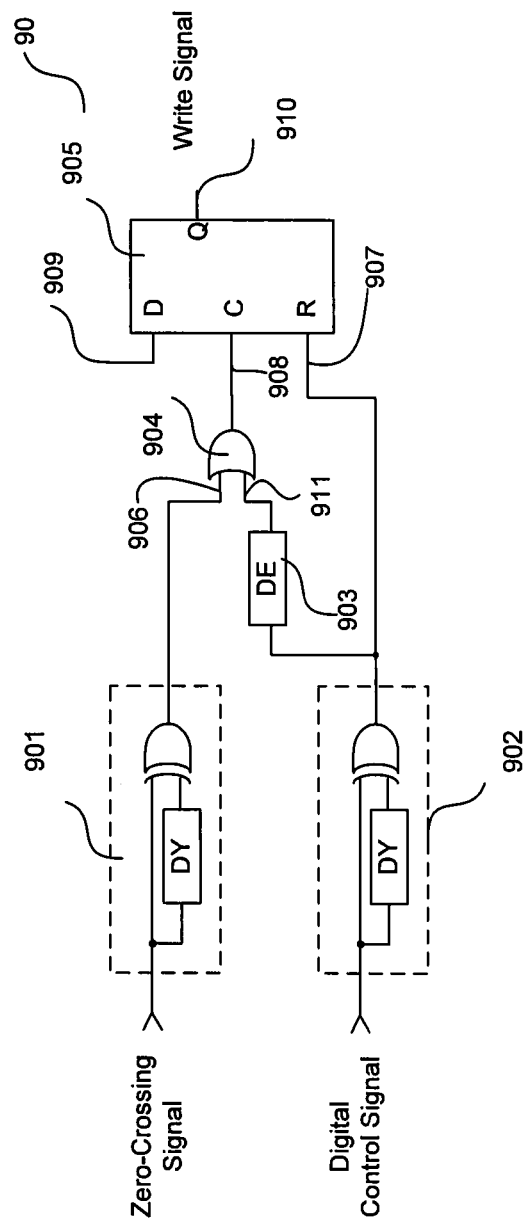
FIG. 9 depicts a schematic circuitry of a maximum write time setting circuit 90 according to an embodiment of the present invention.

FIG. 9 shows a schematic circuitry of a maximum write time setting circuit 90 according to an embodiment of the present invention. Maximum write time setting circuit 90 comprises a first pulse generating circuits 901 and a second pulse generating circuit 902. Wherein first pulse generating circuit 901 is configure to monitor the change on digital control signal at control end 301, and to generate a first sharp pulse signal accordingly, while the second pulse generating circuit 902 is configured to monitor the zero-crossing signal at the output end 815 of the zero-crossing monitoring circuit 81, and also to generate a second sharp pulse signal accordingly.

The digital control signal at control end 301 may changes bit to bit, such as from 10 to 01, from 10 to 11, It also could change jumpily, such as from 00 to 11. For easier analysis, it assumes that digital control signal only has one bit and changes from 0 to 1 or from 1 to 0 in the following instruction. However, it should be known that digital control signal may have a bit-width other than 1-bit or 2-bit in other embodiments.

In the illustrated embodiment, maximum write time setting circuit 90 further comprises a delay unit 903 (DE), an OR gate 904, a D flip-flop 905. Delay unit 903 is configured to set a delay period T2. D flip-flop 905 comprises three input ends which are digital signal end D (909), reset end R (907) and system clock end C (908), and an output end Q (910). The digital signal end D (909) always receives a high level signal. The output end Q is in low level if the reset end R is in high level. While the high voltage level on the digital signal end D is transferred to the output end Q and latches the state at the rising edge of the clock signal on the clock end C if the reset end R is in low level.

In one embodiment, once the digital control signal is changed, second pulse generating circuit 902 generates the second pulse to the reset R end 907 configured to reset D flip-flop 905. The second pulse is also delayed by the delay unit 903. Thus a delayed second pulse is further transmitted to a first input end 911 of OR gate 904 after the delay period T2. During the period T2, first pulse generating circuit 901 generates the first pulse signal to a second input end 906 of OR gate 904 if it receives a zero-crossing signal from control end 301. The first pulse is transmitted to the clock end C of D flip-flop 905 as a clock signal through OR gate 904. Afterward, a flip is triggered on the output end. Otherwise, if the pulse generating circuit 901 does not receive a zero-crossing signal during the period T2, the second pulse is transmitted to the clock end C as the clock signal configured to trigger a flip on the output end Q at the end of period T2. The rising edge of the flip on the output end Q serves as the write signal.

In another embodiment, the signal on reset end R 907 serves as the write signal to set the maximum write time to zero. In yet another embodiment, the signal on the second input end 906 of OR gate 904 serves as the write signal to set the maximum write time to infinite. In still another embodiment, the maximum write time can be externally adjusted by changing the delay time T2 of delay unit 903.

Figure 10A:
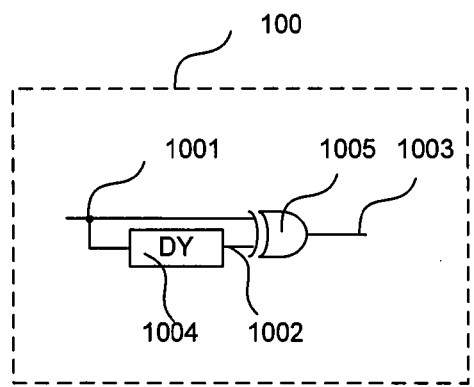
FIG. 10A depicts a schematic circuitry of a pulse generating circuit 100 according to an embodiment of the present invention.

FIG. 10A illustrates a schematic circuitry of a pulse generating circuit 100 according to an embodiment of the present invention. Pulse generating circuit 100 comprises a delay circuit (DY) 1004 and a XOR gate 1005. Delay circuit 1004 is configured to delay an input signal 1001 and to generate a signal 1002. XOR gate 1005 is configured to receive the signals 1001 and 1002 and operable to generate a signal 1003.

Figure 10B:
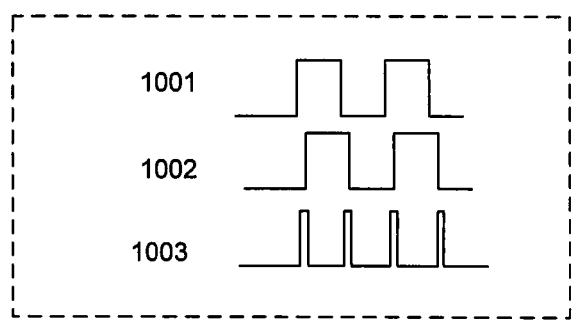
FIG. 10B depicts an operational waveform of circuitry of a pulse generating circuit 100 according to an embodiment of the present invention.

As shown in FIG. 10B, an operational waveform diagram is depicted. When a flip is triggered on signal 1001, signal 1002 tracks signal 1001 with a delay period. During the delay period, XOR gate 1005 generates a pulse signal 1003. Therefore, the on-time of pulse signal 1003 depends on the delay period of delay circuit 1004 and may last several tens or hundreds of nanoseconds.

In other embodiments, maximum write time setting circuit 90 may be replaced by directly coupling the zero-crossing signal 304 to register 308. In that case, the maximum write time is infinite, digital control signal at control end 301 is written into register 308 when the output signal or input signal crosses zero.

Figure 11:
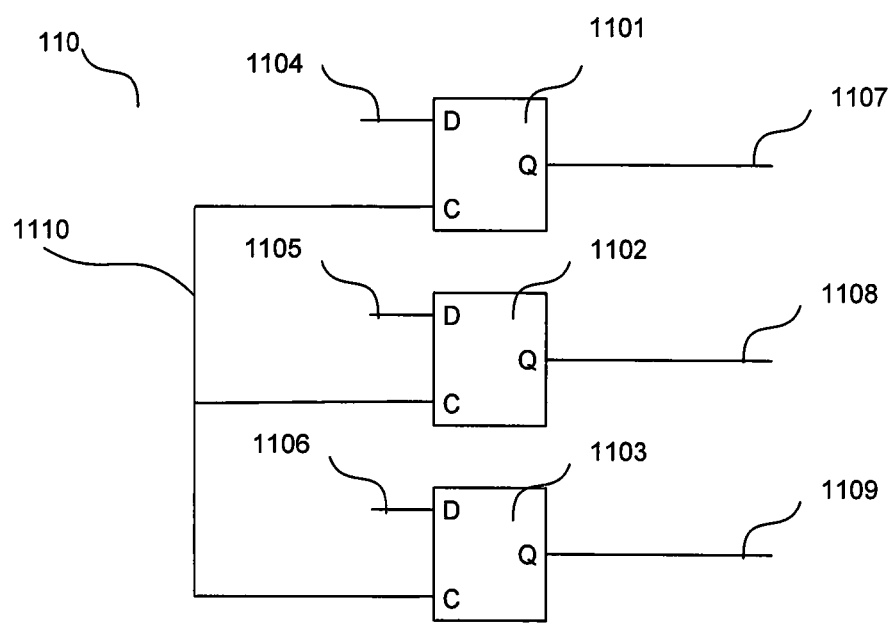
FIG. 11 depicts a schematic circuitry of a register 110 according to an embodiment of the present invention.

FIG. 11 shows a schematic circuitry of a register 110 according to an embodiment of the present invention. Register 110 comprises three D flip-flops 1101, 1102 and 1103. Each of the D flip-flop has an digital signal end D configured to receive a digital control signal, an clock end C configured to receive a write signal, and an output end Q configured to generate a gain control signal. Thus register 110 latches digital control signals 1104, 1105 and 1106 and generates gain control signals 1107, 1108 and 1109 at the rising edge of write signal 1110. In other embodiments, Register 110 may comprise T flip-flops, flop-latches and other suitable device.

Figure 12A:
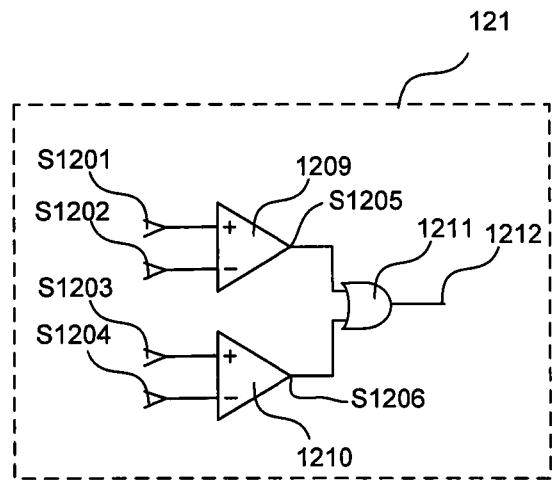
FIG. 12A depicts a schematic circuitry of a peak detecting circuit 121 in the automatic gain control system 41 and 61 according to certain embodiments of the present invention.

FIG. 12A shows a schematic circuitry of a peak detecting circuit 121 in the automatic gain control system 41 and 61 according to certain embodiments of the present invention. Peak detecting circuit 121 comprises a first comparator 1209, a second comparator 1210, and an OR gate 1211. First comparator 1209 comprises a positive input end S1201, a negative input end S1202 and an output end S1205. Second comparator 1210 also comprises a positive input end S1203, a negative input end S1204 and an output end S1206. Output ends S1205 and S1206 are coupled to the input ends of the OR gate 1211.

Figure 12B:
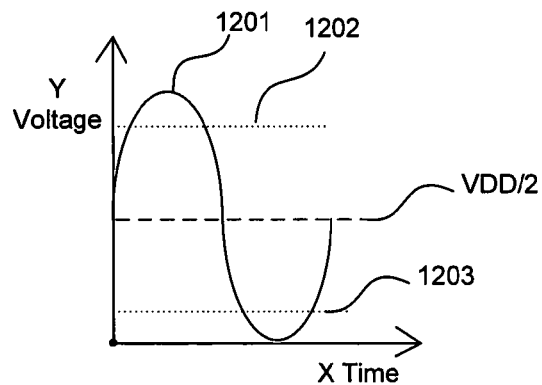
FIG. 12 B depicts an operational waveform diagram of peak detecting circuit 121 according to an embodiment of the present invention.
FIG. 12C depicts an operation waveform diagram of peak detecting circuit 121 according to some other embodiments of the present invention.

In one embodiment, a single-ended input signal 1201 is coupled to input ends S1201 and S1204. An upper threshold voltage 1202 and a lower threshold voltage 1203 are coupled to input ends S1202 and S1203 respectively. FIG. 12B shows an operational waveform diagram of peak detecting circuit 121 according to this embodiment. The dotted straight lines from the top down respectively represent upper threshold voltage 1202, common mode voltage VDD/2 and lower threshold voltage 1203. When input signal 1201 is higher than the upper threshold voltage 1202 or lower than the lower threshold voltage 1203, OR gate 1211 generates a high level signal as overrun incident signal.

Figure 12C:
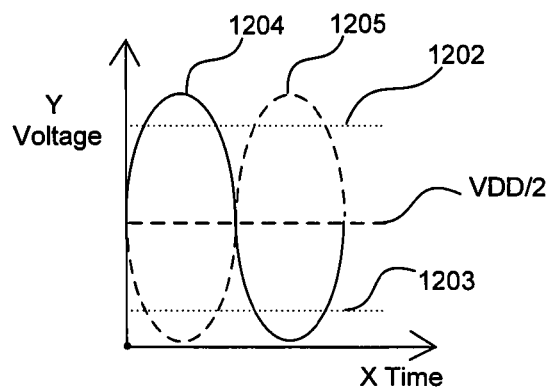

FIG. 12C illustrates an operation waveform diagram of peak detecting circuit 121 according to some other embodiments of the present invention. In the illustrated embodiments, the input signal may comprise a pair of differential signals 1204 and 1205. In one embodiment, signal 1204 or 1205 is coupled to input ends S1201 and S1204, and the upper threshold voltage 1202 and lower threshold voltage 1203 are coupled as described above. In other embodiments, signals 1204 and 1205 are coupled to input ends S1201 and S1203 respectively. The upper threshold voltage 1202 is coupled to both the inputs end S1202 and S1204. In yet another embodiment, signals 1204 and 1205 are coupled to input ends S1202 and S1204 respectively. The lower threshold voltage 1203 is coupled to both input ends S1201 and S1203. As shown in FIG. 12C, the dotted straight lines from the top down respectively represent upper threshold voltage 1202, common mode voltage VDD/2 and lower threshold voltage 1203. Once an input signal is over a threshold voltage, OR gate 1211 generates a high level signal as overrun incident signal.

In one embodiment, the high level signal generated by OR gate 1211 may be viewed as an overrun incident is happening. In other embodiment, comparators 1209 and 1210 may be a hysteresis comparator.

Figure 13:
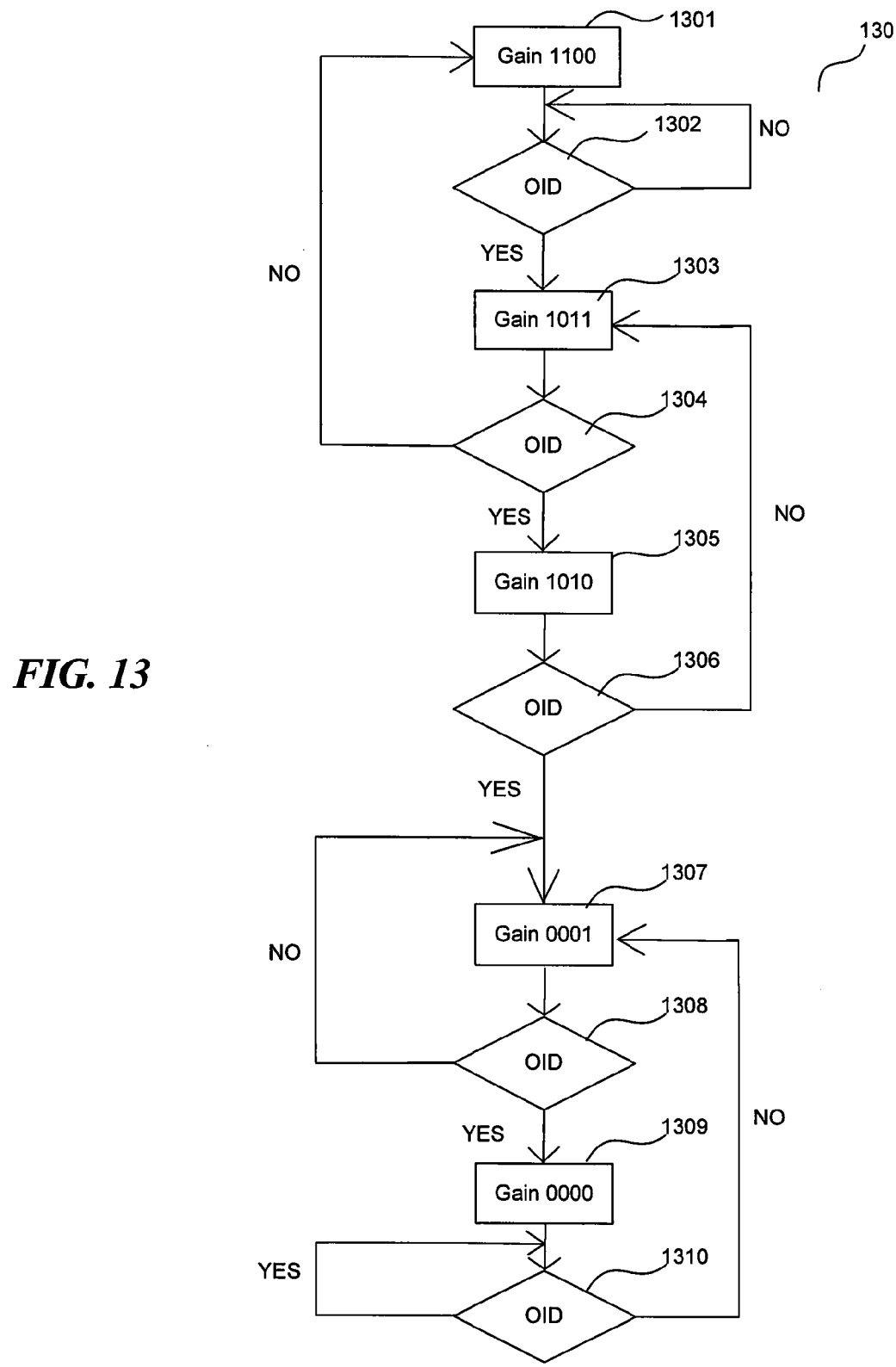
FIG. 13 depicts an operational process flow diagram of logic circuit 403 according to an embodiment of the present invention.

FIG. 13 illustrates an operational process flow diagram of logic circuit 403. Logic circuit 403 is configured to change the digital control signal at control end 301 according to the overrun incident signal from the peak detecting circuit 401. In some embodiments, logic circuit 403 receives an initial value as digital control signal appearing at control end 301 and is configured to change this value only if there is an overrun incident occurred from the peak detecting circuit 401. For better understanding, in the illustrated embodiment, the digital control signal is supposed to be a 4-bit binary digital signal, and the initial value is set to 1100. However, in other embodiments, the digital control may be an N bit digital signal and other values may be utilized as the initial value, wherein N is a positive integer.

As seen in FIG. 13, the digital control signal is represented by "Gain". For example, at step 1301, Gain 1100 means the digital control signal is 1100 at initial At step 1302, logic circuit 403 monitors the output signal of peak detecting circuit 401. Gain 1100 is maintained as digital control signal at control end 301 if logic circuit 401 does not receive an overrun incident signal. Otherwise, Gain 1100 is lowered switched to a Gain 1011 if the logic circuit 403 receives an overrun incident signal (OID).

Referring to step 1303, to prevent the system from oscillation, once the Gain is switched to a new value, it is maintained at the value for a period T3. In one embodiment, logic circuit 403 may stop monitoring the output signal of peak detecting circuit 401 during period T3. In another embodiment, logic circuit 403 may monitor but not response to the output signal of peak detecting circuit 401 during period T3. In yet some other embodiments, other suitable methods may be applied.

At step 1304, the logic circuit 403 monitors the output signal of the peak detecting circuit 401. Gain 1011 may be restored to Gain 1100 if the logic circuit does not receive an overrun incident signal in a constant period T4. Otherwise, Gain 1011 may be switched to Gain 1010 if the logic circuit receives an overrun incident signal.

The term "restore" hereby and in the following description means that the Gain is set back to the previous value. The term "switch" hereby and in the following description means that the Gain is set forward to the next value. In the illustrated embodiment, the change of the Gain value is bit by bit. Therefore the value of the Gain is increased by 1 if a restore action occurs, or the value of the Gain is decreased by 1 if a switch action occurs. However, in other embodiments, other rules may be utilized to change the value of the Gain.

At step 1305, the Gain may be maintained at Gain 1010 for a period T3 as it does in step 1303.

At step 1306, the logic circuit 403 monitors the output signal of the peak detecting circuit 401. Gain 1010 may be restored to 1011 if the logic circuit does not receive an overrun incident signal in the constant period T4. Otherwise, Gain 1010 may be switched to Gain 1001 (not shown) if the logic circuit receives an overrun incident signal.

At step 1307, the Gain may be maintained at Gain 0001 for a period T3 as it does in step 1303.

At step 1308, the logic circuit 403 monitors the output signal of the peak detecting circuit 401. Gain 0001 may be restored to Gain 0010 (not shown) if the logic circuit does not receive an overrun incident signal in the constant period T4. Otherwise Gain 0001 may be switched to Gain 0000 if the logic circuit receives an overrun incident signal.

At step 1309, Gain may be maintained at Gain 0000 for a period T3 as it does in step 1303.

At step 1310, the logic circuit 403 monitors the output signal of the peak detecting circuit 401. The Gain 0000 may be restored to 0001 if the logic circuit does not receive an overrun incident signal in the constant period T4. Otherwise Gain 0000 may be maintained if the logic circuit receives an overrun incident signal.

In the illustrated embodiment, the initial Gain 1100 is corresponding to the largest gain which may not increase even no overrun incident signal is received.

Similarly, the smallest gain is 0000, which may not decrease even an overrun incident is received. Gain 0000 is the minimum gain value.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention may utilize values that are different from what is specified herein.

We claim:

1. A zero-crossing gain control system, comprising:
    a gain control unit, comprising an input end configured to receive an input signal, and an output end configured to provide an output signal, and a control end configured to receive a gain control signal;
    a zero-crossing monitoring circuit coupled to the output end or the input end of the gain control unit, wherein the zero-crossing monitoring circuit is responsive from either the input signal or the output signal of the gain control unit, and is operable to generate a zero-crossing signal when the output signal or the input signal crosses zero; and
    a register coupled between the zero-crossing monitoring circuit and the control end of the gain control unit, configured to latch a digital control signal and generates the gain control signal according to the zero-crossing signal and the digital control signal and further comprising:
    a maximum write time setting circuit, coupled between the zero-crossing monitoring circuit and the register, responsive from the zero-crossing signal and the digital control signal, and is operable to generate a write signal.

2. The zero-crossing gain control system according to claim 1, wherein:
    the maximum write time setting circuit is configured to generate the write signal when the maximum write time setting circuit receives the zero-crossing signal, or the maximum write time setting circuit is configured to generate the write signal at the end of the maximum write time when the maximum write time setting circuit does not receive a zero-crossing signal for a maximum write time according to a change occurred on the digital control signal; and
    the register is configured to generate the gain control signal according to the write signal.

3. The zero-crossing gain control system according to claim 2, wherein the maximum write time is fixed.

4. The zero-crossing gain control system according to claim 2, wherein said maximum write time is adjustable.

5. The zero-crossing gain control system according to claim 1, wherein the maximum write time setting circuit comprises:
    a first pulse generating circuit, responsive from the zero-crossing signal, and operable to generate a first pulse;
    a second pulse generating circuit, responsive from the change on the digital control signal, and operable to generate a second pulse;
    a delay unit, responsive from the second pulse, and operable to generate a delayed second pulse;
    an OR gate, responsive from the first pulse and the delayed second pulse, and operable to generate a clock signal; and
    a D flip-flop, responsive from the second pulse, the clock signal and a high level signal, and operable to generate the write signal.

6. The zero-crossing gain control system according to claim 1, wherein the gain control unit comprises at least an amplifier and a resistor network.

7. The zero-crossing gain control system according to claim 1, wherein the zero-crossing monitoring circuit receives either a single-ended signal or a pair of differential signals, and wherein the zero-crossing gain control system generates the zero-crossing signal when the single-ended signal crosses a common-mode voltage signal or the differential signals cross each other.

8. A zero-crossing gain control system, comprising:
    a gain control unit, comprising an input end configured to receive an input signal, and an output end configured to provide an output signal, and a control end configured to receive a gain control signal;
    a zero-crossing monitoring circuit coupled to the output end or the input end of the gain control unit, wherein the zero-crossing monitoring circuit is responsive from either the input signal or the output signal of the gain control unit, and is operable to generate a zero-crossing signal when the output signal or the input signal crosses zero; and a register coupled between the zero-crossing monitoring circuit and the control end of the gain control unit, configured to latch a digital control signal and generates the gain control signal according to the zero-crossing signal and the digital control signal and further comprising:

a peak detecting circuit coupled to the output end of the gain control unit, responsive from the output signal, and operable to generate an overrun incident signal if the output signal exceeds a predetermined threshold level; and a logic circuit coupled to the peak detecting circuit and the register, responsive from the overrun incident signal and an initial signal, and operable to generate the digital control signal.

9. The zero-crossing gain control system according to claim 8, wherein the peak detecting circuit receives either a single-ended signal or a pair of differential signals.

10. The zero-crossing gain control system according to claim 8 wherein:

the logic circuit switches the digital control signal when the overrun incident signal is received or the logic circuit restores the digital control signal when the overrun incident signal is not received for a first period; and the digital control signal is maintained for a second period after a change occurred.

11. The zero-crossing gain control system according to claim 10 wherein the logic circuit switches or restores the digital control signal bit by bit.

12. The zero-crossing gain control system according to claim 8 wherein the digital control signal has a maximum value and a minimum value, wherein the maximum value is the initial signal and the minimum value is N bits zero, wherein N is a positive integer.

13. A zero-crossing gain control method, comprising:

generating a zero-cross signal according to either a zero-crossing state of an input signal or an output signal from a gain control system;

generating a gain control signal according to the zero-cross signal and a digital control signal; and further comprising:

generating the gain control signal immediately when the zero-cross signal is generated; and generating the gain control signal at the end of a maximum write time if a zero-crossing signal is not generated for the maximum write time after a change occurred on the digital control signal; and controlling the gain of the gain control system according to the gain control signal.

14. The zero-crossing gain control method according to claim 13, further comprising:

generating an overrun incident signal if the output signal exceeds a predetermined threshold level; and processing the digital control signal according to the overrun incident signal and an initial signal.

15. The zero-crossing gain control method according to claim 14, wherein processing the digital control signal comprises:

switching the digital control signal if overrun incident signal is generated; and restoring the digital control signal if overrun incident signal is not generated during a first period;

wherein the digital control signal is maintained for a second period after a change occurred.

16. The zero-crossing gain control method according to claim 15, wherein lowering or restoring the digital control signal is bit by bit.

17. The zero-crossing gain control method according to claim 15, wherein the digital control signal having a maximum and a minimum values, wherein the maximum value is initial signal and the minimum value is N bits zero, wherein N a positive integer.

* * * * *